United States Patent
Otsubo et al.

(10) Patent No.: US 12,446,157 B2
(45) Date of Patent: Oct. 14, 2025

(54) MODULE

(71) Applicant: Murata Manufacturing Co., Ltd., Kyoto-fu (JP)

(72) Inventors: Yoshihito Otsubo, Nagaokakyo (JP); Minoru Komiyama, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 399 days.

(21) Appl. No.: 18/063,794

(22) Filed: Dec. 9, 2022

(65) Prior Publication Data

US 2023/0105635 A1 Apr. 6, 2023

Related U.S. Application Data (63) Continuation of application No. PCT/JP2021/021338, filed on Jun. 4, 2021.

(30) Foreign Application Priority Data

Jun. 16, 2020 (JP) .................................. 2020-103942

(51) Int. Cl.
*H05K 1/18* (2006.01)
*H05K 1/11* (2006.01)

(52) U.S. Cl.
CPC ............ *H05K 1/181* (2013.01); *H05K 1/113* (2013.01); *H05K 2201/0364* (2013.01);
(Continued)

(58) Field of Classification Search
CPC .................. H05K 1/181; H05K 1/113; H05K 2201/0364; H05K 2201/0715;
(Continued)

(56) References Cited

U.S. PATENT DOCUMENTS

| | | | | |
|---|---|---|---|---|
| 5,140,110 A | * | 8/1992 | Nakagawa | ........... H05K 1/0218 174/250 |
| 2005/0162841 A1 | * | 7/2005 | Ogatsu | ................ H05K 9/0039 361/816 |
| 2012/0020039 A1 | | 1/2012 | Coffy et al. | |
| 2013/0082367 A1 | | 4/2013 | Yoo | |
| 2013/0170147 A1 | * | 7/2013 | Dang | ..................... H01L 24/97 361/728 |
| 2019/0273312 A1 | | 9/2019 | Otsubo | |

(Continued)

FOREIGN PATENT DOCUMENTS

JP 2018-088460 A 6/2018
JP 6459019 B2 1/2019
(Continued)

OTHER PUBLICATIONS

International Search Report for PCT/JP2021/021338 dated Aug. 31, 2021.

*Primary Examiner* — Timothy J Thompson
*Assistant Examiner* — Paramita Ghosh
(74) *Attorney, Agent, or Firm* — McDonald Hopkins LLC (57) ABSTRACT

A module includes a substrate having a first surface, components as one or more components mounted on the first surface, a resin film covering the one or more components along a shape of the one or more components and covering part of the first surface, a first shield film formed to overlap the resin film, and a first sealing resin as a sealing resin disposed to cover the first surface, the one or more components, and the first shield film. A stack including the resin film and the first shield film has a first opening. A first columnar conductor is disposed to be electrically connected to the first surface through the first sealing resin and the first opening. The first shield film is electrically connected to the first columnar conductor in the first opening.

16 Claims, 6 Drawing Sheets

(52) U.S. Cl.
CPC ............... *H05K 2201/0715* (2013.01); *H05K 2201/09481* (2013.01); *H05K 2201/09618* (2013.01); *H05K 2201/10545* (2013.01); *H05K 2201/10734* (2013.01); *H05K 2201/10931* (2013.01)

(58) Field of Classification Search
CPC .......... H05K 2201/09481; H05K 2201/09618; H05K 2201/10545; H05K 2201/10734; H05K 2201/10931; H05K 1/0219; H05K 3/284; H05K 1/0216; H05K 2201/0723; H05K 2201/10242; H05K 9/00; H05K 1/02; H05K 1/11; H01L 23/00
See application file for complete search history.

(56) References Cited

U.S. PATENT DOCUMENTS

| | | |
|---|---|---|
| 2019/0393166 A1 | 12/2019 | Otsubo |
| 2020/0281102 A1 | 9/2020 | Otsubo et al. |
| 2021/0204395 A1 | 7/2021 | Yamamoto et al. |

FOREIGN PATENT DOCUMENTS

| | | |
|---|---|---|
| WO | 2018/101384 A1 | 6/2018 |
| WO | 2018/164158 A1 | 9/2018 |
| WO | 2018/181708 A1 | 10/2018 |
| WO | 2019/098316 A1 | 5/2019 |
| WO | 2020/067468 A1 | 4/2020 |

\* cited by examiner

MODULE

CROSS REFERENCE TO RELATED APPLICATION

This is a continuation of International Application No. PCT/JP2021/021338 filed on Jun. 4, 2021 which claims priority from Japanese Patent Application No. 2020-103942 filed on Jun. 16, 2020. The contents of these applications are incorporated herein by reference in their entireties.

BACKGROUND OF THE DISCLOSURE

Field of the Disclosure

The present disclosure relates to a module.

Description of the Related Art

Japanese Patent No. 6459019 (PTL 1) discloses a sealing laminate sheet that has a first region including a first thermosetting resin composite and includes a first layer with insulation properties, a second layer including a second thermosetting resin composite, and an electrically conductive material disposed between these two layers. PTL 1 also discloses an electronic component module including such a sealing laminate sheet. In this electronic component module, a plurality of electronic components are mounted on a circuit board, and the plurality of electronic components are collectively sealed with the sealing laminate sheet.

PTL 1: Japanese Patent No. 6459019

BRIEF SUMMARY OF THE DISCLOSURE

When shielding performance is to be ensured with an electrically conductive material included in a sealing laminate sheet, grounding of the electrically conductive material is required. PTL 1 describes that a hole for grounding connection is provided in the first layer to expose the electrically conductive material. However, it is difficult to reliably perform grounding connection with this configuration. Also, a degree of freedom in grounding connection (hereinafter also referred to as "grounding") of the electrically conductive material included in the sealing laminate sheet is low.

The present disclosure therefore has a possible benefit to provide a module that has enhanced shielding performance and enables easy grounding.

In order to achieve the above possible benefit, a module according to the present disclosure includes a substrate having a first surface, one or more components mounted on the first surface, a resin film covering the one or more components along a shape of the one or more components and covering part of the first surface, a first shield film formed to overlap the resin film, and a sealing resin disposed to cover the first surface, the one or more components, and the first shield film. A stack including the resin film and the first shield film has a first opening. A first columnar conductor is disposed to be electrically connected to the first surface through the sealing resin and the first opening. The first shield film is electrically connected to the first columnar conductor in the first opening.

According to the present disclosure, shielding performance can be enhanced. Moreover, the first shield film is electrically connected to the first columnar conductor such that the first columnar conductor passes through the first opening, leading to easy grounding.

DETAILED DESCRIPTION OF THE DISCLOSURE

The dimensional ratios shown in the figures do not necessarily represent actual dimensions faithfully, and may be exaggerated for convenience of explanation. In the description below, when reference is made to the concepts "above" or "below", it does not necessarily mean the absolute "above" or "below", but may mean relative "above" or "below" in the posture illustrated.

Embodiment 1

A module in Embodiment 1 according to the present disclosure will be described with reference to FIGS. 1 to 8.

Figure 1:
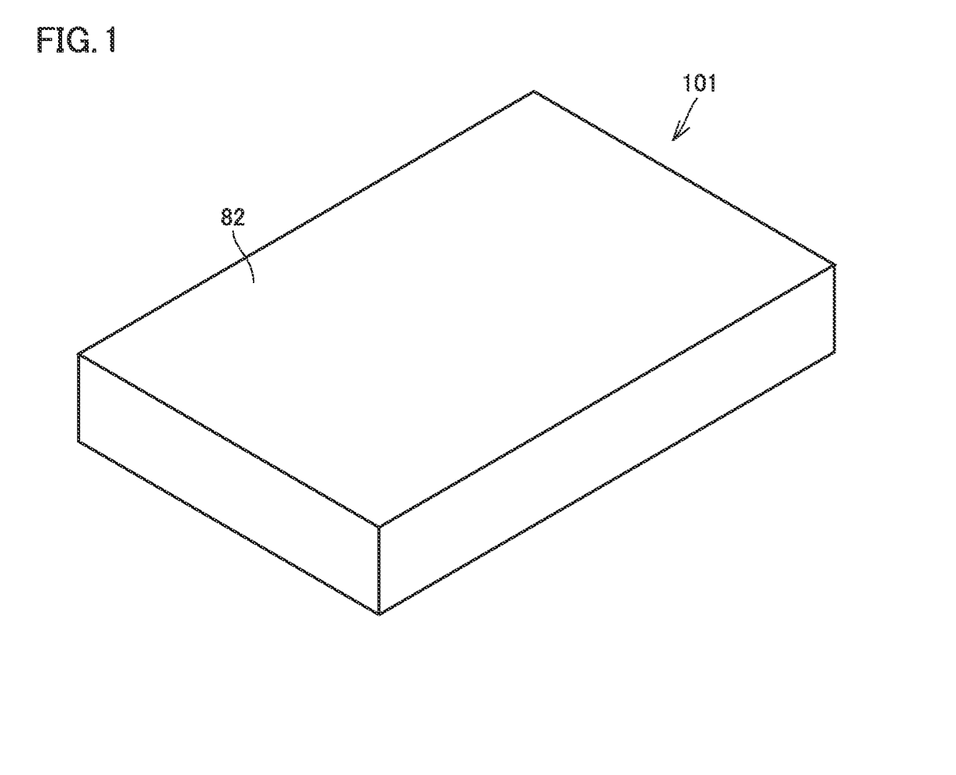
FIG. 1 is a first perspective view of a module in Embodiment 1 according to the present disclosure.
Figure 2:
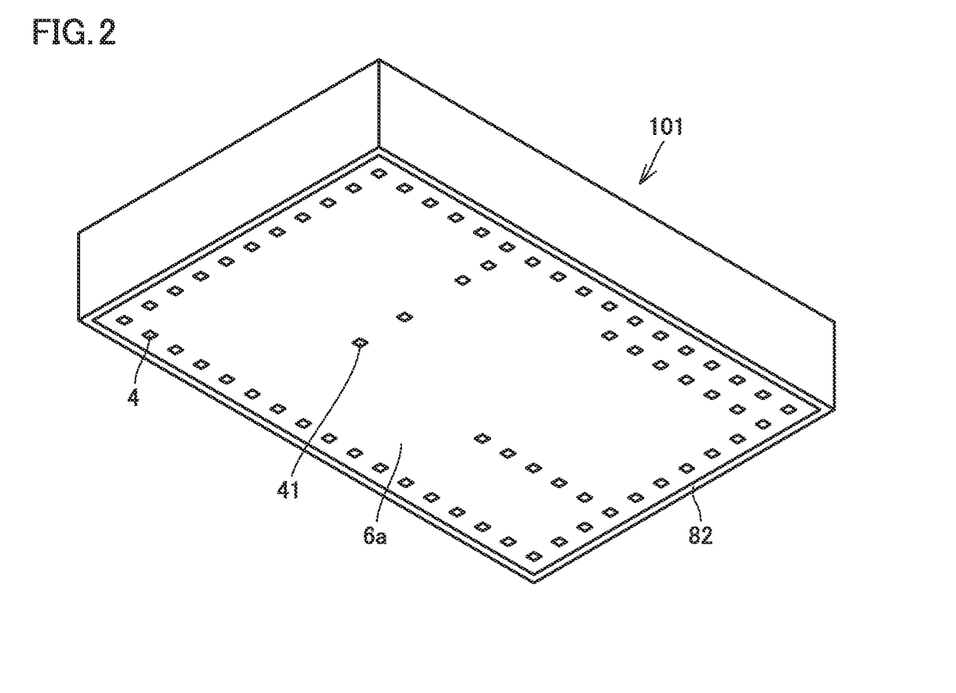
FIG. 2 is a second perspective view of the module in Embodiment 1 according to the present disclosure.
Figure 3:
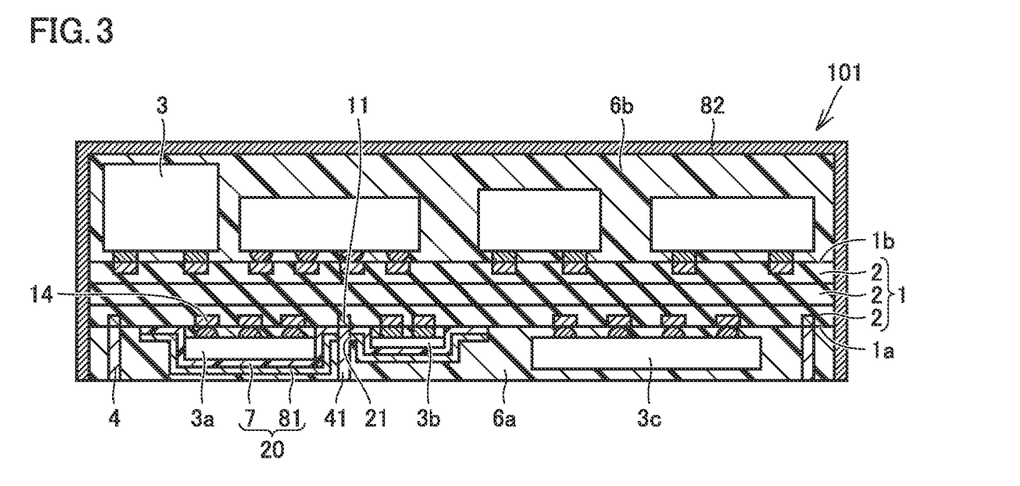
FIG. 3 is a sectional view of the module in Embodiment 1 according to the present disclosure.

FIG. 1 shows the outer appearance of a module 101 in the present embodiment. The entire module 101 normally has a rectangular parallelepiped shape. FIG. 1 mainly shows a surface of module 101 opposite to a mounting surface. FIG. 2 is a perspective view of module 101 as seen in the direction in which the mounting surface is seen. FIG. 3 is a sectional view of module 101.

Module 101 includes a substrate 1. Substrate 1 is formed as a stack of a plurality of insulating layers 2. Substrate 1 has a first surface 1a and a second surface 1b. In the example herein, a plurality of components are mounted on each of first surface 1a and second surface 1b. Pad electrodes 14 are disposed on each of first surface 1a and second surface 1b of substrate 1. At least components 3a, 3b, 3c are mounted on first surface 1a via pad electrodes 14. A stack 20 is disposed to be in close contact with components 3a, 3b and first surface 1a. Stack 20 includes a resin film 7 and a first shield film 81. Stack 20 is obtained by deformation of a sheet-shaped material. First surface 1a is sealed with a first sealing resin 6a. Several components 3 are also mounted on second surface 1b. Second surface 1b and components 3 mounted on second surface 1b are sealed with a second sealing resin 6b. The upper surface and the side surface of module 101 are covered with a second shield film 82.

The configuration of module 101 can be expressed as follows. Module 101 in the present embodiment includes substrate 1 having first surface 1a, components 3a, 3b as one or more components mounted on first surface 1a, resin film 7, first shield film 81 formed to overlap resin film 7, and first sealing resin 6a as the sealing resin. Resin film 7 covers components 3a, 3b as the one or more components along the shapes of components 3a, 3b and covers part of first surface 1a. First sealing resin 6a as the sealing resin is disposed to cover first surface 1a, components 3a, 3b, and first shield film 81. Although description is given here while focusing on that components 3a, 3b are covered with resin film 7, resin film 7 may cover components other than components 3a, 3b. In the example described in the present embodiment, resin film 7 covers the components other than components 3a, 3b as well.

Stack 20 may include only two layers, that is, resin film 7 and first shield film 81, or may include another layer in addition to these two layers. Stack 20 including resin film 7 and first shield film 81 has a first opening 21. A first columnar conductor 41 is disposed to be electrically connected to first surface 1a through first sealing resin 6a and first opening 21. First shield film 81 is electrically connected to first columnar conductor 41 in first opening 21.

Figure 4:
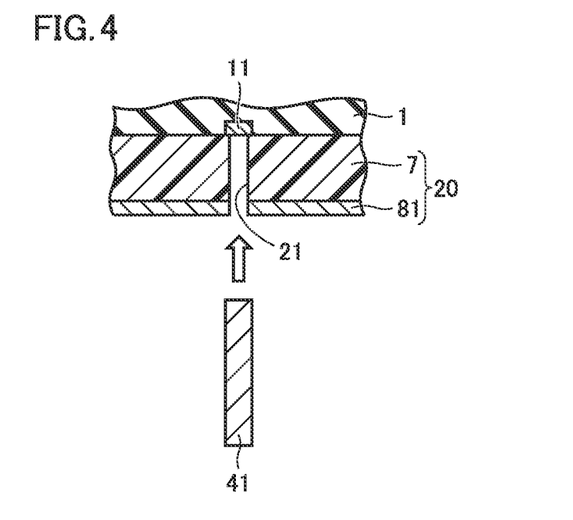
FIG. 4 is a view for illustrating a first method of connecting a first columnar conductor and a stack of the module in Embodiment 1 according to the present disclosure.
Figure 5:
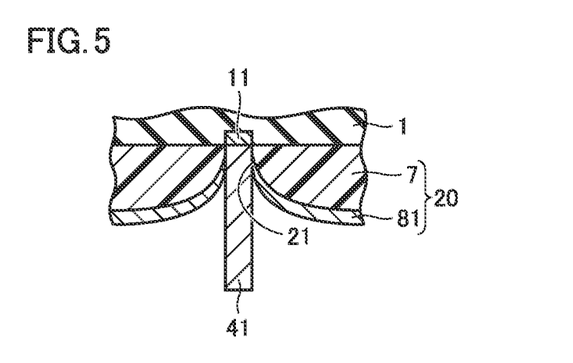
FIG. 5 is an enlarged view showing a first state of connection between the first columnar conductor and the stack of the module in Embodiment 1 according to the present disclosure.

The following can be said about the structure of electrical connection between first shield film 81 and first columnar conductor 41 in first opening 21. In this portion, the structure as shown in FIG. 5 may be provided by insertion of first columnar conductor 41 as indicated by the arrow with stack 20, having first opening 21, already attached to first surface 1a of substrate 1, as shown in FIG. 4, for example.

Figure 6:
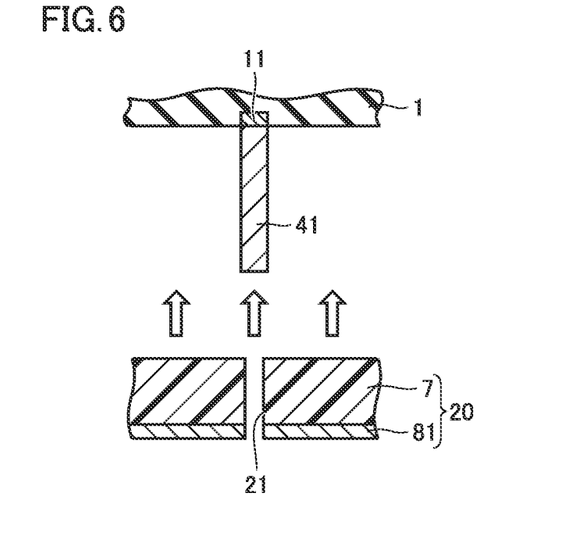
FIG. 6 is a view for illustrating a second method of connecting the first columnar conductor and the stack of the module in Embodiment 1 according to the present disclosure.
Figure 7:
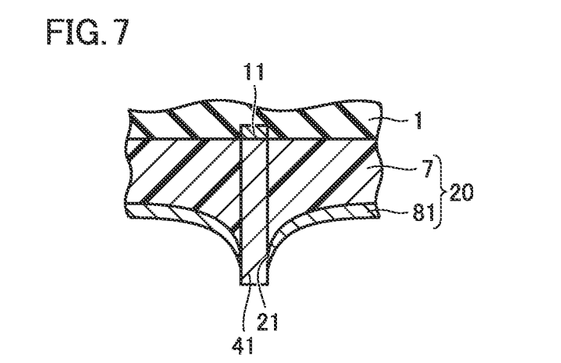
FIG. 7 is an enlarged view showing a second state of connection between the first columnar conductor and the stack of the module in Embodiment 1 according to the present disclosure.

In contrast, as shown in FIG. 6, stack 20 may be combined as indicated by the arrows with first columnar conductor 41 already mounted on first surface 1a of substrate 1, thus allowing first columnar conductor 41 to be inserted into first opening 21 provided in stack 20 in advance. In this case, the structure shown in FIG. 7 is obtained. The vicinity of first opening 21 of stack 20 may have the structure of either FIG. 5 or 7 in module 101. FIGS. 5 and 7 merely show examples, and the present disclosure is not limited to the shown shape. Although stack 20 is deformed due to the insertion of first opening 21 in FIGS. 5 and 7, such a deformation does not necessarily occur.

A ground electrode 11 is disposed on first surface 1a of substrate 1. The end of first columnar conductor 41 on the substrate 1 side is connected to ground electrode 11.

Figure 8:
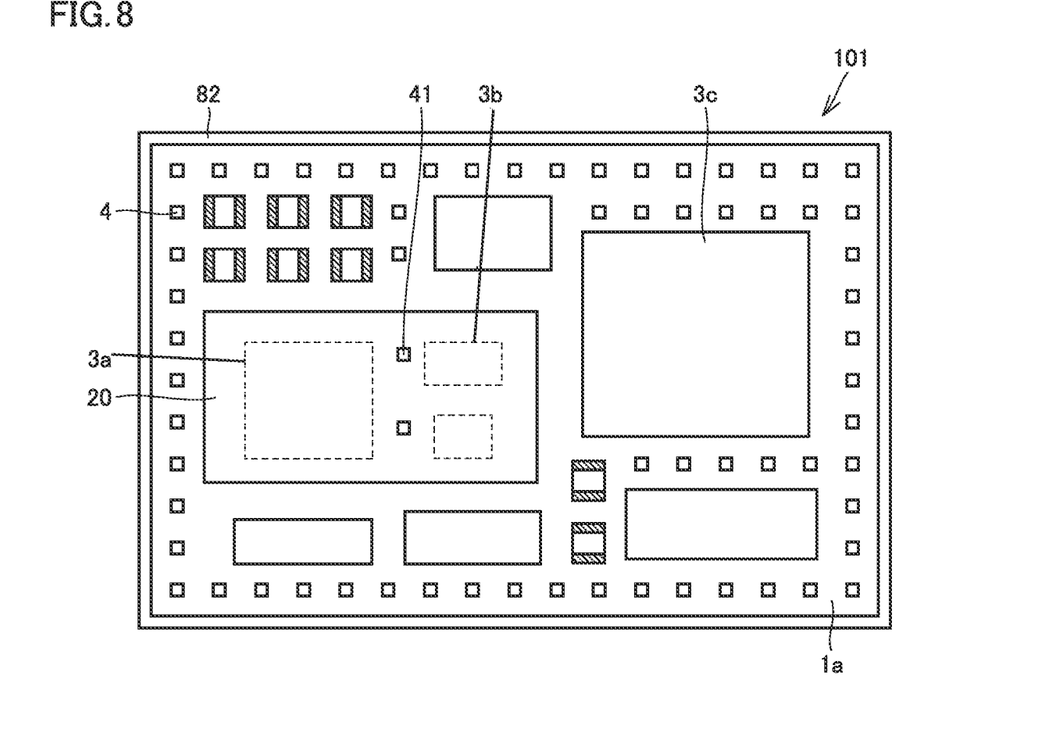
FIG. 8 is a bottom view of the module in Embodiment 1 according to the present disclosure with a first sealing resin removed therefrom.

FIG. 8 shows module 101 with first sealing resin 6a removed therefrom, which is seen from directly below. Columnar conductors 4 are arranged along the outer perimeter. Stack 20 is disposed to cover a partial region of first surface 1a. Some components are hidden by stack 20, and such components are indicated by the dashed lines. Two first columnar conductors 41 passing through stack 20 are disposed between component 3a and component 3b. The number and arrangement of columnar conductors 4 and first columnar conductors 41 are merely shown as examples, and the present disclosure is not limited thereto. As shown in FIG. 8, some components may be mounted on first surface 1a in addition to components 3a, 3b, 3c. Any other component may be covered with stack 20 in addition to components 3a, 3b.

In the present embodiment, first shield film 81 is disposed to cover component 3a at a position closer to component 3a, thus enhancing shielding performance. First shield film 81 can be disposed with a height approximately equal to the height of component 3a, leading to a lower height of the module. Further, stack 20 has first opening 21, and first shield film 81 and first columnar conductor 41 are electrically connected such that first columnar conductor 41 passes through first opening 21, leading to easy and reliable grounding.

As described in the present embodiment, the end of first columnar conductor 41 opposite to substrate 1 is preferably exposed to the outermost surface. Such a configuration enables grounding of first columnar conductor 41 with the use of the end surface of first columnar conductor 41 opposite to substrate 1. In the configuration in which module 101 is mounted on a motherboard or the like with the use of the surface of first sealing resin 6a opposite to substrate 1, the end surface of first columnar conductor 41 opposite to substrate 1 can be directly connected to the ground electrode or the like prepared in advance on the motherboard or the like.

As described in the present embodiment, the one or more components are preferably a plurality of components, and first columnar conductor 41 is preferably disposed between the plurality of components. This is because such a configuration can enhance shielding between the components. First columnar conductor 41 is disposed between component 3a and component 3b in the present embodiment, and accordingly, shielding between components 3a, 3b can be enhanced.

Description has been given while focusing on components 3a, 3b as "one or more components" herein, the number of components may be three or more. It is needless to say that "one or more components" may be a single component alone. For example, the number of components covered with stack 20 may be one.

Embodiment 2

Figure 9:
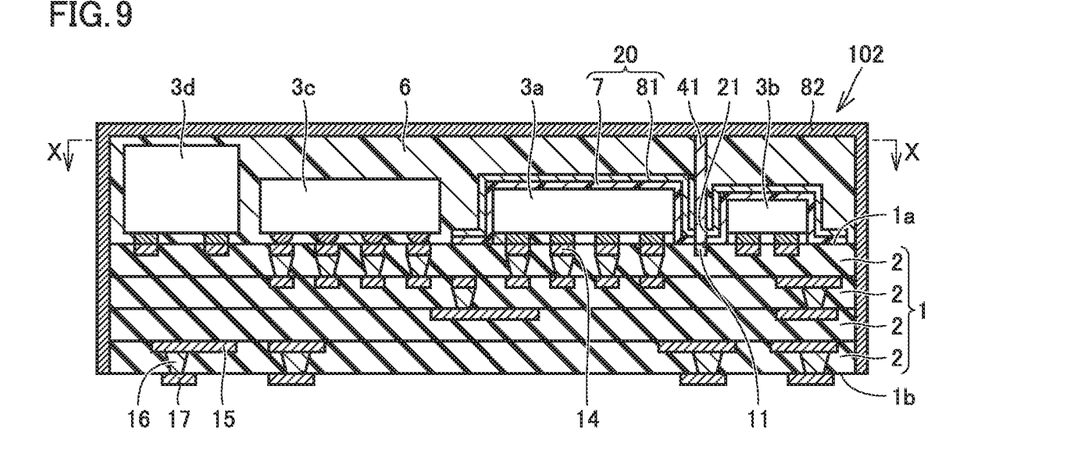
FIG. 9 is a sectional view of a module in Embodiment 2 according to the present disclosure.
Figure 10:
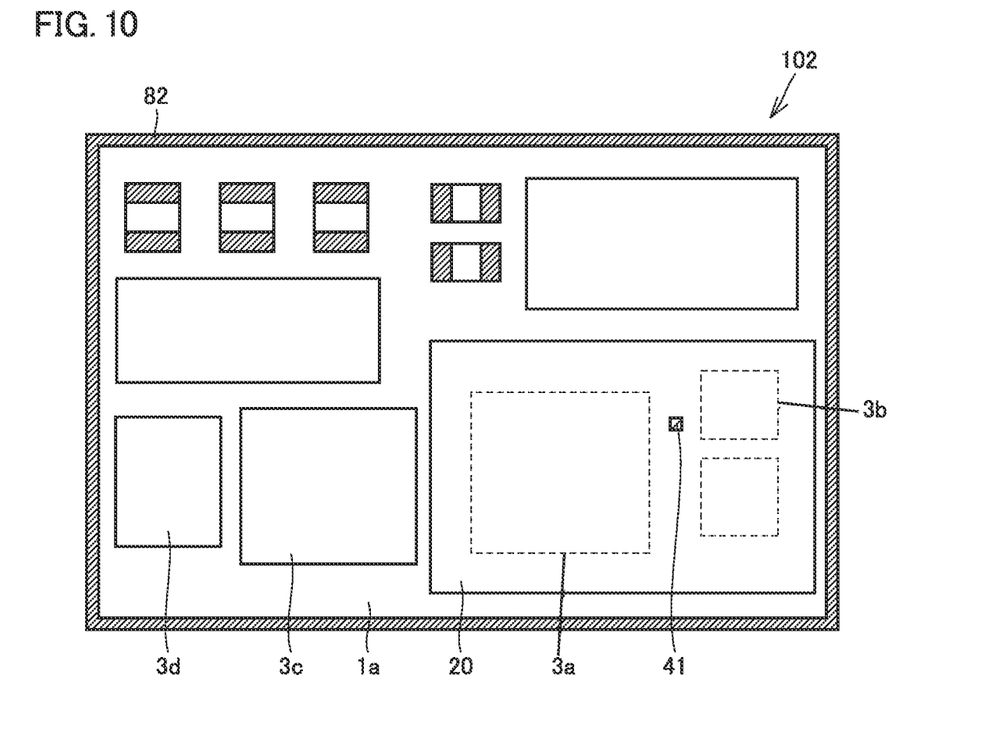
FIG. 10 is a sectional view taken along the line X-X in FIG. 9.

A module in Embodiment 2 according to the present disclosure will be described with reference to FIGS. 9 and 10. FIG. 9 is a sectional view of a module 102 in the present embodiment. In the present embodiment, the positional relation between first surface 1a and second surface 1b of substrate 1 may be the inverse of that of Embodiment 1. Specifically, the upper surface of substrate 1 is first surface 1a, and the lower surface is second surface 1b. Components 3a, 3b, 3c, 3d are mounted on first surface 1a. Stack 20 is disposed to cover components 3a, 3b of the above-mentioned components. Stack 20 has first opening 21. Module 102 includes sealing resin 6 disposed to cover first surface 1a, component 3a, and first shield film 81. First columnar conductor 41 is disposed to be electrically connected to first surface 1a through sealing resin 6 and first opening 21. Module 102 includes second shield film 82 covering sealing resin 6, and first columnar conductor 41 is electrically connected to second shield film 82. FIG. 10 is a sectional view taken along the line X-X in FIG. 9. For illustrative purpose, FIG. 10 shows the state in which sealing resin 6 is removed.

In the present embodiment, second shield film 82 covers sealing resin 6 and first columnar conductor 41 is electrically connected to second shield film 82, and thus, any one of first shield film 81 and second shield film 82 can be grounded by grounding the other. For example, in the configuration in which the grounding conductor pattern built in substrate 1 is exposed to the side surface of substrate 1 to be electrically connected to second shield film 82 for grounding of second shield film 82, first shield film 81 is electrically connected to second shield film 82 via first columnar conductor 41, and thus, first shield film 81 can be grounded with the use of a ground potential of second shield film 82 without separate grounding of first shield film 81 through another route.

Although the components are mounted only on first surface 1a and no components are mounted on second surface 1b in the example shown in FIG. 9, this is merely an example. For example, the components may be mounted on second surface 1b in addition to first surface 1a. In an alternative configuration, the components may be mounted on second surface 1b that is the lower surface, and second surface 1b and the components mounted thereon may be covered with a sealing resin.

Embodiment 3

Figure 11:
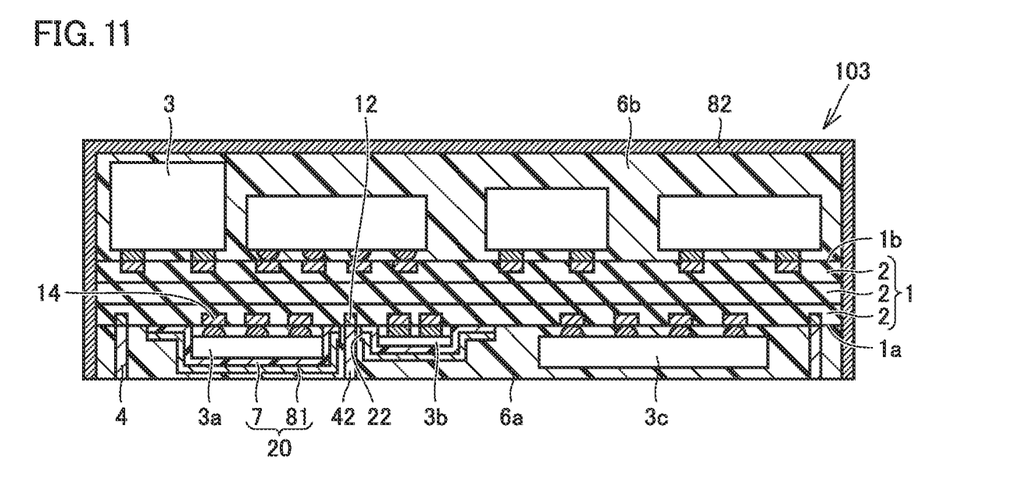
FIG. 11 is a sectional view of a module in Embodiment 3 according to the present disclosure.
Figure 12:
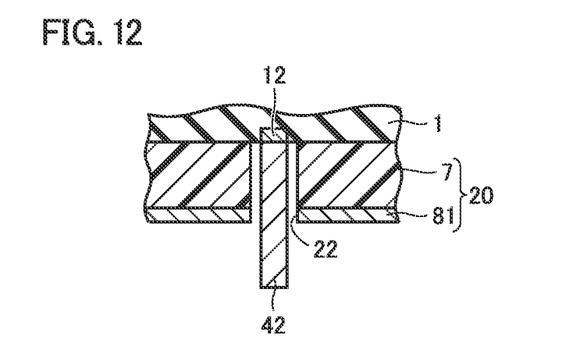
FIG. 12 is an enlarged view of a second columnar conductor of the module and therearound in Embodiment 3 according to the present disclosure.

A module in Embodiment 3 according to the present disclosure will be described with reference to FIGS. 11 to 13. FIG. 11 is a sectional view of a module 103 in the present embodiment. In the present embodiment, the positional relation between first surface 1a and second surface 1b of substrate 1 is the same as that of Embodiment 1 and is the inverse of that of Embodiment 2. Specifically, the lower surface of substrate 1 is first surface 1a, and the upper surface is second surface 1b. In module 103, second columnar conductor 42 is mounted on first surface 1a. FIG. 12 is an enlarged view of second columnar conductor 42 and therearound.

In module 103, a signal electrode 12 is provided on first surface 1a. Stack 20 including resin film 7 and first shield film 81 has a second opening 22. Second columnar conductor 42 is disposed to be electrically connected to signal electrode 12 through first sealing resin 6a as a sealing resin and second opening 22. First shield film 81 is remote from signal electrode 12 in second opening 22. In other words, second opening 22 has a diameter larger than the diameter of second columnar conductor 42. The end of second columnar conductor 42 opposite to substrate 1 is exposed to the outermost surface.

Figure 13:
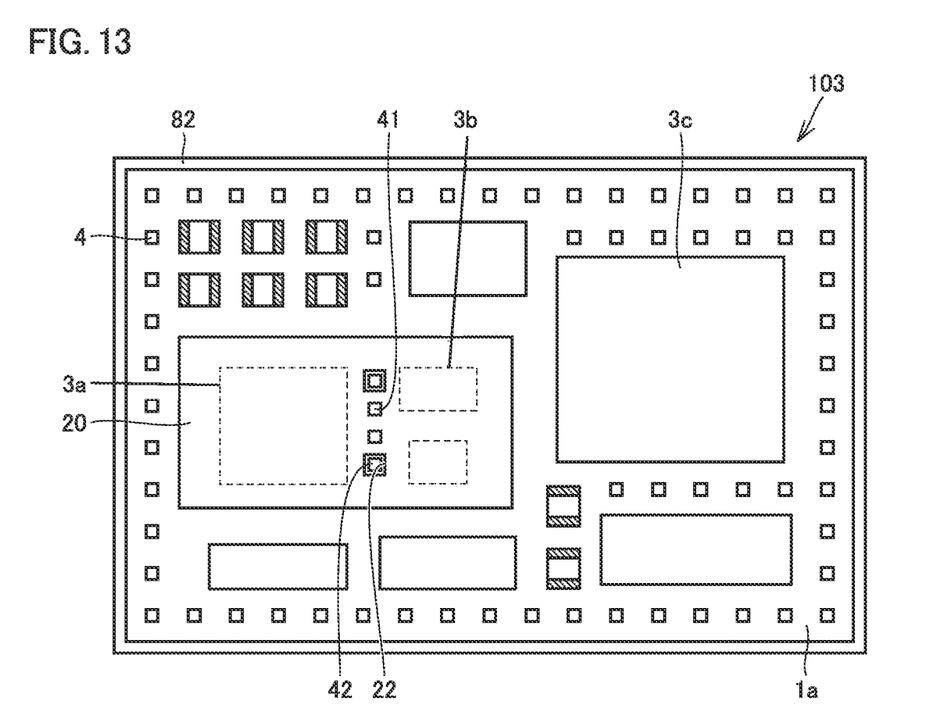
FIG. 13 is a bottom view of the module in Embodiment 3 according to the present disclosure with a first sealing resin removed therefrom.

FIG. 13 shows module 103 with first sealing resin 6a removed therefrom, which is seen from directly below. Two first columnar conductors 41 and two second columnar conductors 42 are disposed within stack 20. The number and positional relation shown here are mere examples, and the present disclosure is not limited thereto. First columnar conductor 41 passes through first opening 21 of stack 20, and first columnar conductor 41 is in contact with stack 20 therearound. Second columnar conductor 42 passes through second opening 22 of stack 20, and second columnar conductor 42 is remote from stack 20 therearound. Second opening 22 is larger than the outer shape of second columnar conductor 42.

In the present embodiment, grounding of first columnar conductor 41 can be performed with the use of the end surface of first columnar conductor 41 opposite to substrate 1, and signal connection to second columnar conductor 42 can be performed with the use of the end surface of second columnar conductor 42 opposite to substrate 1. Second columnar conductor 42 can be disposed also in the region of stack 20 as seen in plan view, leading to a higher degree of design freedom.

As described in the present embodiment, substrate 1 preferably has second surface 1b as the surface opposite to first surface 1a, and other components are preferably mounted on second surface 1b. In other words, the module preferably includes a so-called double-sided mounting structure. This is because such a configuration can mount more components using substrate 1 having a limited area, thus achieving higher functionality efficiently. Although the present embodiment has described the example in which the lower surface of substrate 1 is first surface 1a and stack 20 is disposed on the first surface 1a side, the present disclosure is not limited thereto. For example, other components may be mounted on second surface 1b in the configuration of module 102 described in Embodiment 2. In other words, in an alternative configuration, the upper surface of substrate 1 may be first surface 1a, stack 20 may be disposed on the first surface 1a side, and other components may be mounted on second surface 1b as the lower surface of substrate 1. In this case, second surface 1b is preferably covered with a sealing resin separate from sealing resin 6 covering first surface 1a. Second shield film 82 preferably extends to cover the side surface of the sealing resin on the second surface 1b side.

Some of the embodiments described above may be combined as appropriate.

The embodiments described above and disclosed herein are illustrative in all respects and should not be construed as being restrictive. The scope of the present disclosure is defined by the terms of the claims, and is intended to include any modifications within the meaning and scope equivalent to the terms of the claims.

1 substrate; 1a first surface; 1b second surface; 2 insulating layer; 3, 3a, 3b, 3c component; 4 columnar conductor; 6 sealing resin; 6a first sealing resin; 6b second sealing resin; 7 resin film; 11 ground electrode; 12 signal electrode; 14 pad electrode; 15 conductor pattern; 16 conductor via; 17 external electrode; 20 stack; 21 first opening; 22 second opening; 41 first columnar conductor; 42 second columnar conductor; 81 first shield film; 82 second shield film; 101, 102, 103 module.

The invention claimed is:
1. A module comprising:
a substrate having a first surface;
one or more components mounted on the first surface;
a resin film covering the one or more components along a shape of the one or more components and covering a part of the first surface;
a first shield film provided to overlap the resin film; and
a sealing resin disposed to cover the first surface, the one or more components, and the first shield film, wherein
a stack including the resin film and the first shield film has a first opening penetrating both the resin film and the first shield film,
a first columnar conductor is disposed to be electrically connected to the first surface through the sealing resin and the first opening, and
the first shield film is electrically connected to the first columnar conductor in the first opening.
2. The module according to claim 1, wherein an end of the first columnar conductor opposite to the substrate is exposed to an outermost surface.

3. The module according to claim 2, wherein the one or more components are a plurality of components, and the first columnar conductor is disposed between the plurality of components.

4. The module according to claim 2, wherein
the first surface is provided with a signal electrode,
the stack including the resin film and the first shield film has a second opening,
the module further comprises a second columnar conductor disposed to be electrically connected to the signal electrode through the sealing resin and the second opening, and
the second opening has a diameter larger than a diameter of the second columnar conductor.

5. The module according to claim 2, wherein
the substrate has a second surface as a surface opposite to the first surface, and
another component is mounted on the second surface.

6. The module according to claim 1, wherein the one or more components are a plurality of components, and the first columnar conductor is disposed between the plurality of components.

7. The module according to claim 6, wherein
the first surface is provided with a signal electrode,
the stack including the resin film and the first shield film has a second opening,
the module further comprises a second columnar conductor disposed to be electrically connected to the signal electrode through the sealing resin and the second opening, and
the second opening has a diameter larger than a diameter of the second columnar conductor.

8. The module according to claim 6, wherein
the substrate has a second surface as a surface opposite to the first surface, and
another component is mounted on the second surface.

9. The module according to claim 1, wherein
the first surface is provided with a signal electrode,
the stack including the resin film and the first shield film has a second opening,
the module further comprises a second columnar conductor disposed to be electrically connected to the signal electrode through the sealing resin and the second opening, and
the second opening has a diameter larger than a diameter of the second columnar conductor.

10. The module according to claim 9, wherein
the substrate has a second surface as a surface opposite to the first surface, and
another component is mounted on the second surface.

11. The module according to claim 9, wherein an end of the second columnar conductor opposite to the substrate is exposed to an outermost surface.

12. The module according to claim 11, wherein
the substrate has a second surface as a surface opposite to the first surface, and
another component is mounted on the second surface.

13. The module according to claim 1, further comprising a second shield film covering the sealing resin,
wherein the first columnar conductor is electrically connected to the second shield film.

14. The module according to claim 13, wherein
the substrate has a second surface as a surface opposite to the first surface, and
another component is mounted on the second surface.

15. The module according to claim 1, wherein the substrate has a second surface as a surface opposite to the first surface, and
another component is mounted on the second surface.

16. A module comprising:
a substrate having a first surface;
one or more components mounted on the first surface;
a resin film covering the one or more components along a shape of the one or more components and covering a part of the first surface;
a first shield film provided to overlap the resin film; and
a sealing resin disposed to cover the first surface, the one or more components, and the first shield film, wherein:
a stack including the resin film and the first shield film has a first opening,
a first columnar conductor is disposed to be electrically connected to the first surface through the sealing resin and the first opening,
the first shield film is electrically connected to the first columnar conductor in the first opening,
a second shield film covering the sealing resin, and
the first columnar conductor is electrically connected to the second shield film.

* * * * *